United States Patent
Baumgartner et al.

(10) Patent No.: US 7,437,690 B2
(45) Date of Patent: *Oct. 14, 2008

(54) METHOD FOR PREDICATE-BASED COMPOSITIONAL MINIMIZATION IN A VERIFICATION ENVIRONMENT

(75) Inventors: Jason R. Baumgartner, Austin, TX (US); Hari Mony, Austin, TX (US); Viresh Paruthi, Austin, TX (US); Fadi A. Zaraket, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 401 days.

This patent is subject to a terminal disclaimer.

(21) Appl. No.: 11/249,937

(22) Filed: Oct. 13, 2005

(65) Prior Publication Data

US 2007/0106963 A1     May 10, 2007

(51) Int. Cl.
*G06F 17/50* (2006.01)

(52) U.S. Cl. .................... 716/2; 716/8; 716/9
(58) Field of Classification Search ............ 716/2, 716/8, 9
See application file for complete search history.

(56) References Cited

U.S. PATENT DOCUMENTS

| 5,491,640 | A | * | 2/1996 | Sharma et al. ............. 716/18 |
| 5,659,555 | A | | 8/1997 | Lee et al. |
| 6,035,109 | A | | 3/2000 | Ashar et al. |
| 6,385,765 | B1 | | 5/2002 | Cleaveland et al. |
| 6,711,730 | B2 | | 3/2004 | Frank et al. |

* cited by examiner

*Primary Examiner*—Jack Chiang
*Assistant Examiner*—Brandon W Bowers
(74) *Attorney, Agent, or Firm*—Libby z. Handelsman; Dillon & Yudell LLP

(57) ABSTRACT

A method for performing verification includes importing a design netlist containing one or more components and computing one or more output functions for the one or more components. One or more output equivalent state sets are generated from the one or more output functions and one or more next-state functions for the one or more components are identified. One or more image equivalent state sets for the one or more next-state functions are produced and one or more output-and-image equivalent state sets are classified for the one or more image equivalent state sets and the one or more output equivalent state sets. One or more input representatives of the one or more equivalent input sets are selected and an input map is formed from the one or more input representatives. The input map is synthesized and injected back into the netlist to generate a modified netlist.

5 Claims, 12 Drawing Sheets

METHOD FOR PREDICATE-BASED COMPOSITIONAL MINIMIZATION IN A VERIFICATION ENVIRONMENT

BACKGROUND OF THE INVENTION

1. Field of the Invention

The present invention relates in general to verifying designs and in particular to reducing resource requirements during verification. Still more particularly, the present invention relates to a system, method and computer program product for predicate based compositional minimization in a transformation based verification environment.

2. Description of the Related Art

With the increasing penetration of microprocessor-based systems into every facet of human activity, demands have increased on the microprocessor development and production community to produce systems that are free from data corruption. Microprocessors have become involved in the performance of a vast array of critical functions, and the involvement of microprocessors in the important tasks of daily life has heightened the expectation of reliability of calculative results. Whether the impact of errors would be measured in human lives or in mere dollars and cents, consumers of microprocessors have lost tolerance for error-prone results. Consumers will not tolerate, by way of example, miscalculations on the floor of the stock exchange, in the medical devices that support human life, or in the computers that control their automobiles. All of these activities represent areas where the need for reliable microprocessor results has risen to a mission-critical concern.

Formal and semiformal verification techniques provide powerful tools for discovering errors in verifying the correctness of logic designs. Formal and semiformal verification techniques frequently expose probabilistically uncommon scenarios that may result in a functional design failure. Frequently, formal and semiformal verification techniques provide the opportunity to prove that a design is correct (i.e., that no failing scenario exists).

Unfortunately, formal verification techniques require computational resources which are exponential with respect to the size of the design under test. In particular, many formal analysis techniques require exponential resources with respect to the number of state elements in the design under test. Semiformal verification techniques leverage formal methods on larger designs by applying them only in a resource-bounded manner, though at the expense of incomplete verification coverage; generally, coverage decreases as design size increases.

Numerous approaches have thus been proposed to reduce the complexity of a design under verification. For example, bisimulation minimization techniques seek to iteratively collapse equivalent states from the design's state transition representation. While such techniques may yield large reductions in state space, they address a PSPACE-complete problem, and the resulting resource cost may outweigh the savings by the verification framework, when compared to methods such as such as symbolic invariant checking.

Predicate abstraction techniques build an overapproximate abstraction of the design under verification. These approaches first select a set of predicates of the original design, then compute the set of possible transitions between predicate valuations, using the result as the abstracted transition system. This overapproximation often results in spurious property failures, requiring a refinement step which increases the number of predicates in the abstracted system to tighten the overapproximation. For larger control-intensive netlists, the number of refinement steps may become exorbitant. Furthermore, the abstracted system may exceed the complexity of the original netlist because it uses predicates as variables, which may exceed the number of original state and input variables, often degrading to an inconclusive result.

SUMMARY OF THE INVENTION

A method for performing verification includes importing a design netlist containing one or more components and computing one or more output functions for the one or more components. One or more output equivalent state sets are generated from the one or more output functions and one or more next-state functions for the one or more components are identified. One or more image equivalent state sets for the one or more next-state functions are produced and one or more output-and-image equivalent state sets are classified for the one or more image equivalent state sets and the one or more output equivalent state sets. One or more input representatives of the one or more equivalent input sets are selected and an input map is formed from the one or more input representatives. The input map is synthesized and injected back into the netlist to generate a modified netlist.

BRIEF DESCRIPTION OF THE DRAWINGS

The present invention is described in a preferred embodiment in the following description with reference to the drawings, in which like numbers represent the same or similar elements, as follows.

DETAILED DESCRIPTION OF A PREFERRED EMBODIMENT

The present invention provides a method, system, and computer program product for automated abstraction of netlists through bisimulation detection, which is sound and complete with respect to property checking. Unlike prior-art predicate-based abstraction approaches, which operate on word-level models or require manual guidance, the present invention utilizes a novel linear-time partitioning method to automatically isolate a component of a bit-level netlist graph, whose outputs represent an adequate set of predicates against which to preserve its behavior. Once selected, the present invention determines the equivalence-class of the states of the component which are bisimilar with respect to its predicates, and then determines the equivalence-class of its input space under transitions to bisimilar state sets. The present invention next synthesizes this input equivalence class into the design, to restrict the component's visibility of the original input space to equivalence class representatives thereof. Finally, synergistic transformations such as sequential redundancy removal are used to propagate the reductions enabled by this input restriction through the netlist.

Figure 1:
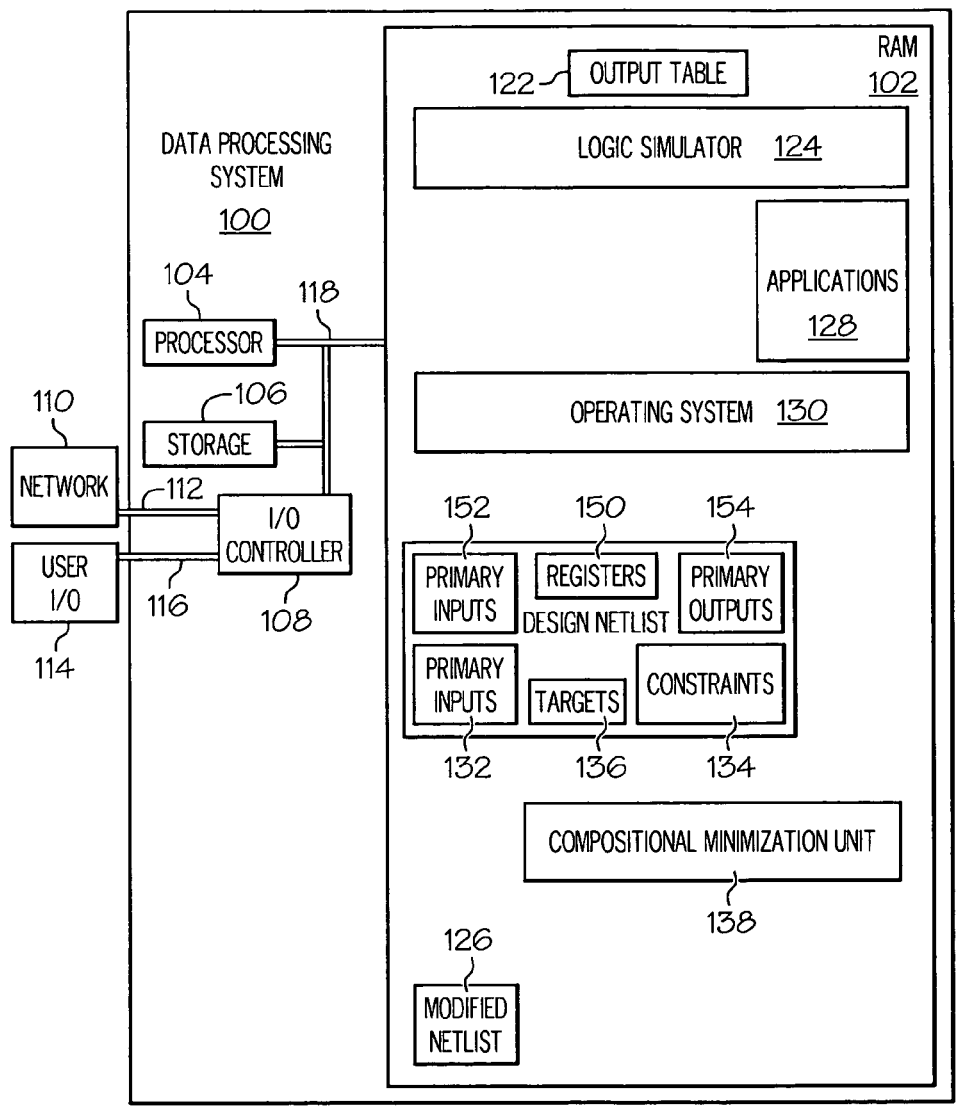
FIG. 1 illustrates a block diagram of a general-purpose data processing system with which the present invention of a method, system and computer program product for predicate-based compositional minimization may be performed.

With reference now to the figures, and in particular with reference to FIG. 1, a block diagram of a general-purpose data processing system, in accordance with a preferred embodiment of the present invention, is depicted. Data processing system 100 contains a processing storage unit (e.g., RAM 102) and a processor 104. Data processing system 100 also includes non-volatile storage 106 such as a hard disk drive or other direct-access storage device. An Input/Output (I/O) controller 108 provides connectivity to a network 110 through a wired or wireless link, such as a network cable 112. I/O controller 108 also connects to user I/O devices 114 such as a keyboard, a display device, a mouse, or a printer through wired or wireless link 116, such as cables or a radio-frequency connection. System interconnect 118 connects processor 104, RAM 102, storage 106, and I/O controller 108.

Within RAM 102, data processing system 100 stores several items of data and instructions while operating in accordance with a preferred embodiment of the present invention, including a design netlist 120 and an output table 122 for interaction with a logic simulator 124. Other applications 128 and logic simulator 124 interface with processor 104, RAM 102, I/O control 108, and storage 106 through operating system 130. Other data structures in RAM 102 include a modified netlist 126, a compositional minimization module 138 and a—140. One skilled in the data processing arts will quickly realize that additional components of data processing system 100 may be added to or substituted for those shown without departing from the scope of the present invention.

A netlist graph, such as design netlist 120, is a popular means of compactly representing circuit structures in computer-aided design of digital circuits. Such a representation is non-canonical and offers limited ability to analyze the function from the nodes in the graph. Design netlist 120 contains a directed graph with vertices representing gates and edges representing interconnections between those gates. The gates have associated functions, such as constraints 134, targets 136, inputs 152, outputs 154, combinational logic (e.g., AND gates), and sequential elements (hereafter referred to as registers 150). Registers 150 have two associated components; their next-state functions and their initial-value functions, which are represented as other gates in the graph or as an initial state data structure 132. Semantically, for a given register 150, the value appearing at its initial-value gate at time "0"("initialization" or "reset" time) will be applied as the value of the register itself; the value appearing at its next-state function gate at time "i" will be applied to the register itself at time "i+1".

Processor 104 executes instructions from programs, often stored in RAM 102, in the course of performing the present invention. In a preferred embodiment of the present invention, processor 104 executes logic simulator 124. Logic simulator 124 performs testing operations, which are well known in the art, on design netlist 120. Logic simulator 124 includes a computer program product, stored in RAM 102 and executed on processor 104, which provides a series of tools for activities such as equivalence checking, property checking, logic synthesis and false-paths analysis. Generally speaking, logic simulator 124 contains rule-based instructions for predicting the behavior of logically modeled items of hardware.

Targets 136 represent nodes whose Boolean expressions are of interest and need to be computed. The goal of the verification process is to find a way to drive a '1' on a target node, or to prove that no such assertion of the target is possible. In the former case, a "counterexample trace" showing the sequence of assignments to the inputs in every cycle leading up to the failure event is generated and recorded to output table 122.

Logic simulator 124 uses the series of rules contained in its own instructions, in conjunction with design netlist 120, to represent the underlying logical problem structurally (as a circuit graph), and includes a Cycle-Based Symbolic Simulator (CBSS), which performs a cycle-by-cycle simulation on design netlist 120 symbolically by applying unique random, or non-deterministic, variables to the design netlist 120 inputs in every cycle.

At each step of the simulation, the Boolean expressions of the target 136 nodes are tested for assertion of a value of '1'. If so, a counterexample trace leading up to the failure (represented by the assertion of the target node to a '1') is returned to output table 122. Constraints 134 need to be factored in before this check for the targets being hit can be done. This factoring is typically accomplished by simply ANDing the Boolean expression for the target with the Boolean expression for each of the constraints 134.

If unsolved targets 136 remain, then the registers 150 are updated with the values, of the next-state functions, and the process continues.

Using the method of the present invention, compositional minimization module 138 identifies bisimilar states within design netlist 120 and copes with the intractability of traditional bisimulation computation in two ways. First, compositional minimization module 138 underapproximates the identified set of bisimilar states within design netlist 120 by identifying subsets of those states within design netlist 120 which are bisimilar under a selected set of predicate labels. Second, compositional minimization module 138 employs preimage computation. With the employment by compositional minimization module 138 of efficient symbolic methods, preimage computation may be performed via static analysis, addressing a problem in NP-space. The resulting underapproximation identifies the majority of truly equivalent states in certain design netlist 120 and thereby enables reductions that go qualitatively beyond related techniques such as retiming and resynthesis and datapath reductions.

In performing the method of the present invention, compositional minimization module 138 abstracts individual components of design netlist 120 to avoid the complexity of analyzing the entire system.

Compositional minimization module 138 injects a combinational filter onto the inputs of a component of design netlist 120 to restrict its visibility of the original input 152 space to a selected representative from each of the equivalence classes thereof. To obtain significant reductions of the resulting modified netlist 126, compositional minimization module 138 exploits other synergistic transformations such as sequential redundancy removal which, though addressing a PSPACE-complete problem, often trade reduction optimality for computational efficiency.

Compositional minimization module 138 thereby performs minimal structural modifications to design netlist 120 to enable its reductions, avoiding the costly sequential reencoding techniques used by prior-art state minimization approaches for synthesis or bisimulation minimization, which in many cases actually increase the complexity of the design being re-encoded. Compositional minimization module 138 thereby also uniquely trivializes the problem of counterexample trace lifting.

A function used by compositional minimization module 138 to perform the required abstractions can be represented as pseudocode as follows:

```
Function_ComputeInputEquivalence(N):
E_q    = ⋀_{j=1}^{|Q|} (q_j = l_j);                     // support: Q, R
E_T    = ∃I. ⋀_{j=1}^{|R|} (r̂_j = f_j);                 // R̂, R
E_qT   = E_q ∧ E_T;                                     // Q, R, R̂
PreImg = (E_qT|_{r_i''=r_i'})|_{r_i''=(r_i'=f_j)};       // Q, R, R', R̂, I
PreImg^a = project((R ∪ Q, PreImg)|_{i_j=i_j'};         // Q, R, R', R̂, I'
I_T    = ∃Q, R̂, R'.(PreImg ∧ PreImg^a);                 // R, I, I'
return I_T;
```

Compositional minimization module 138 uses the Function_ComputeInputEquivalence(N) described above to efficiently perform abstraction symbolically on design netlist 120. Given design netlist 120, compositional minimization module uses variables $Q=<q_1, \ldots, q_m>$ to capture valuations to selected predicates, whose functions over the inputs 152 and registers 150 in their combinational fanin is denoted as $L=<I_f, \ldots, I_m>$. Similarly, present-state register 150 variables are denoted as $R=<r_1, \ldots, r_n>$, whose next-state functions are denoted $F=<f_1, \ldots, f_n>$. Set $E_T$ represents image-equivalent states as a relation over variables R and R-hat, using R-hat as temporary register 150 variables to represent the selected equivalence class. $E_{qT}$ represents the output and image equivalent (OIE) states, and PreImg reflects states and input 152 valuations that transition to these OIE states.

Compositional minimization module 138 contains a function project, which is based upon a compatible projection operator that is used to symbolically map equivalence classes to representatives thereof. Compositional minimization module 138 utilizes project to collapse PreImg down to representatives over R-hat and Q variables, to equivalence-class transitions from present states (over R) to bisimilar next-state representatives (over R-hat and Q). Compositional minimization module 138 additionally maps input variables ij to i'j in PreImg^, so that the conjunction of PreImg^ and PreImg represents equivalence classes of input 152 valuations (over i) and representatives thereof (over i') between transitions from present states (over R) to bisimilar next-states (over R-hat and Q). Quantifying Q and R-hat from the resulting conjunction forms our equivalence relation I_T between original and abstracted inputs on a per-state basis, where (s,i,i') belongs to I_T implies that input stimulus i' may be mapped to i' in state s while preserving bisimilarity.

Figure 2A:
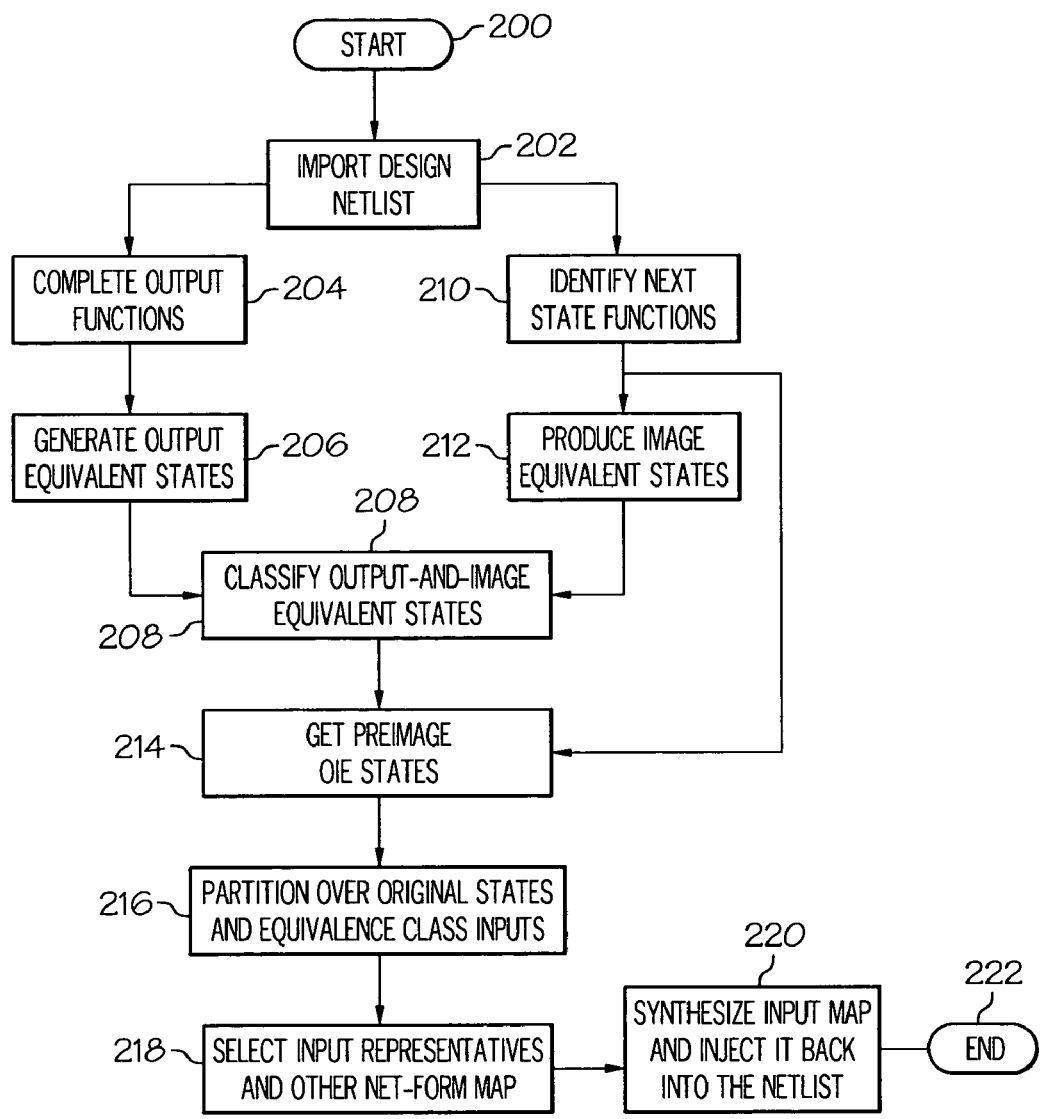
FIG. 2a is a flow diagram of a process for predicate-based compositional minimization, in accordance with the preferred embodiment of the present invention.

Referring now to FIG. 2a, a flow diagram of a process for predicate-based compositional minimization, in accordance with the preferred embodiment of the present invention is depicted. The process starts at step 200, and then proceeds to step 202, which depicts logic simulator 124 importing design netlist 120. The process next moves in parallel along two paths, one through steps 204 and 206 to step 208, and another through step 210, followed step 212 to step 208 or by step 214. At step 204, logic simulator 124 computes output 154 functions. The process then proceeds to step 206, which depicts logic simulator 124 generating output 154 equivalent states, listed as $E_q$ in Function_ComputeInputEquivalence(N).

Returning to step 202, and moving along the parallel path through step 210, the process then next moves to step 210, which illustrates logic simulator 124 identifying next state functions. The process then proceeds in parallel to step 212 and 214. At step 214, compositional minimization module 138 gets a preimage of OIE states, while, at step 212, compositional minimization module 138 produces image equivalent states $E_t$. The process next moves to step 208. At step 208, compositional minimization module 138 classifies output-and-image equivalent states listed as $E_{qt}$ in Function_ComputeInputEquivalence(N). The process then converges to step 214, which is described above, and moves to step 216, which illustrates compositional minimization module 138 performing a partition over original states and equivalent class inputs 152. The process next moves to state 218, which depicts compositional minimization module 138 selecting input 152 representatives and forming an input 152 map, listed as $I_t$ in Function_ComputeInputEquivalence(N). The process then moves to step 220. At step 220, compositional minimization module 138 syntheszies the input 152 map generated in step 218 and injects the input 152 map generated in step 218 back into design netlist 120 to generate modified netlist 126.

Figure 2B:
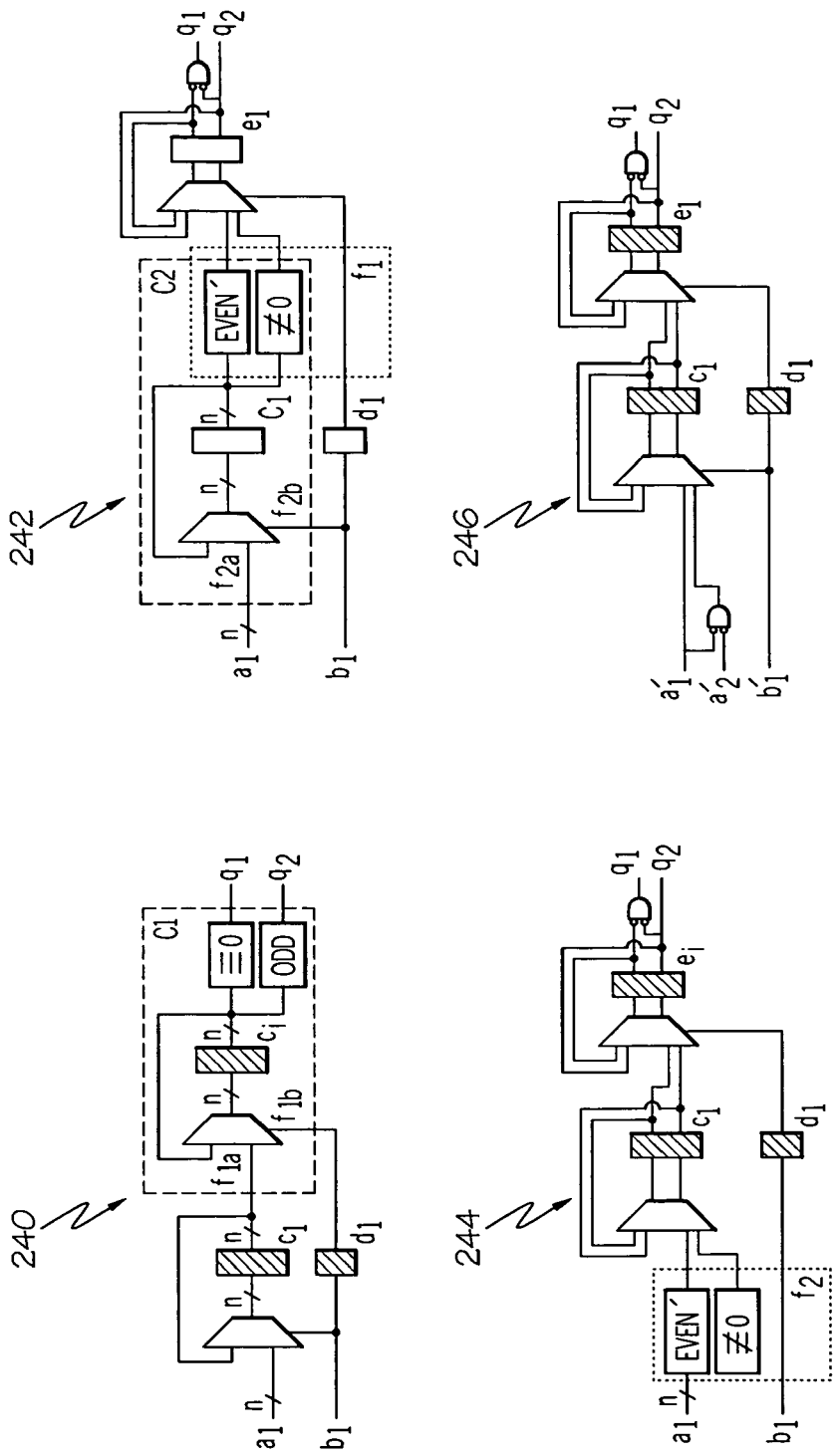
FIG. 2b is a series of example netlists illustrating the results of a process for predicate-based compositional minimization depicted in FIG. 2a, in accordance with the preferred embodiment of the present invention.

Turning now to FIG. 2b, a series of example netlists illustrating the results of a process for predicate-based compositional minimization depicted in FIG. 2a, in accordance with the preferred embodiment of the present invention, is depicted. The operation of compositional minimization module 138 upon an example base netlist 240 illustrates the method and results of the present invention. Example base netlist 240 has an n-bit input 152 vector $<a_1, \ldots, a_n>$ and a single-bit input 152 $b_1$, corresponding to data and control, respectively. An n-bit register 150 vector $<c_1, \ldots, c_n>$ updates with data $a_i$ when $b_1=1$, else holds its current value. The control input 152 is pipelined through register 150 d. When $d_1=1$, the n-bit register 150 vector $<e_1, \ldots, e_n>$ updates with the contents of $c_i$; else it holds its current value. The contents of $e_i$ drive two output 154 predicate gates $q_1$ and $q_2$. Gate $q_1$ evaluates to a 1 if and only if $e_i$ is all zeros. Gate $q_2$ evaluates to a 1 IFF $e_i$ has odd parity.

Assuming that compositional minimization module 138 first abstracts component C1 of example base netlist 240. Compositional minimization module 138 computes output-equivalent states Eq, which consist of four disjoint sets of states: $\{e_i$ is even and nonzero$\}$ when $<q_1,q_2>=00$; $\{e_i$ is odd$\}$ when $<q_1,q_2>=01$; $\{e_i$ is zero$\}$ when $<q_1,q_2>=10$; and 0 when $\{q_1,q_2\}=11$. Compositional minimization module 138 computes the image-equivalent states $E_T$ as the set of all states since the pseudo-inputs $f_{1a}$ and $f_{1b}$ induced by the isolation of C1 enable transitioning $e_i$ to all possible states. Compositional minimization module 138 computes the output and image equivalent (OIE) states $E_{qT}$ as the pairwise intersection of these two sets, equivalent in this case to $E_q$. Compositional minimization module 138 uses this data to compute an equivalence class on the set of input 152 valuations on a per-state basis. In particular, for every state s, compositional minimization module 138 computes the set of all input 152 valuations which transition each partition of OIE states. Compositional minimization module 138 then arbitrarily selects a representative $i_0$ from each of these equivalence classes, and forms a new transition relation. Finally, compositional minimization module 138 synthesizes this relation, and injects the resulting filter logic onto the inputs $f_{1a}$ and $f_{1b}$ of this component.

This structural transformation of example base netlist 240 by compositional minimization module 138 restricts the component's visibility of its original inputs 152 to the selected representatives from the equivalence classes thereof, in a way which preserves bisimilarity. It is noteworthy that—without component extraction—the set of image-equivalent states of example base netlist 240 would be partitioned to the extent that no data reductions would be possible (though $b_1$ may be tied to a 1, as is also possible for component C1). Additionally, it is noteworthy that this abstraction is capable of yielding reductions to more complex netlists, e.g., with data transformations and more complex control logic, even along the feedback paths. The chosen example is simple for clarity of exposition.

Assume that compositional minimization module 138 selects input 152 valuations $f_{1a}=0\ldots011$ to preserve transitions to the OIE set where $<q_1,q_2>=00$; $f_{1a}=0\ldots01$ to preserve transitions to the OIE set where $<q_1,q_2>=01$; and $f_{1a}=0\ldots0$ to preserve transitions to the OIE set where $<q_1,q_2>=10$.

In first intermediate netlist 242, the resulting abstracted netlist is depicted. Logic $f_1$ represents the input filter injected by the abstraction. Predicate Even refers to a check of nonzero yet even parity. Compositional minimization module 138 additionally has deployed redundancy removal within first intermediate netlist 242 to propagate the input 152 filtering through the downstream logic. Because the filtering mapped all but the two least-significant bits of inputs $f_1$ at 0, compositional minimization module 138 reduced the component from n to 2 registers 150. Compositional minimization module 138 additionally simplified the logic driving $q_2$. Note that this transformation is similar to an architectural retiming of the output 154 predicates across the memory bank $e_i$. This is a transformation which classical netlist-based retiming and resynthesis cannot achieve due to the placement of the feedback cycles, illustrating how compositional minimization module 138 subsumes certain retiming and resynthesis moves.

Compositional minimization module 138 next abstracts component C2 of first intermediate netlist 242. Compositional minimization module 138 carries out this abstraction similarly to that of C1, and after redundancy removal yields the second intermediate netlist 244, reducing i from n to 2 registers 150. Finally, compositional minimization module 138 will eparameterize the input space of second intermediate netlist 244, to reduce $a_i$ from n to 2 inputs 152, as depicted in final netlist 246. While abstraction of component inputs 152 by compositional minimization module 138 is generally performed by insertion of filter logic (which does not reduce input count), in the special case that a component input 152 is a true netlist input 152 versus a pseudo-input induced by the partitioning, compositional minimization module 138 quantifies that input 152 and reparameterizes the i' relation. Note that this overall abstraction correlates to an optimal datapath reduction.

Figure 3:
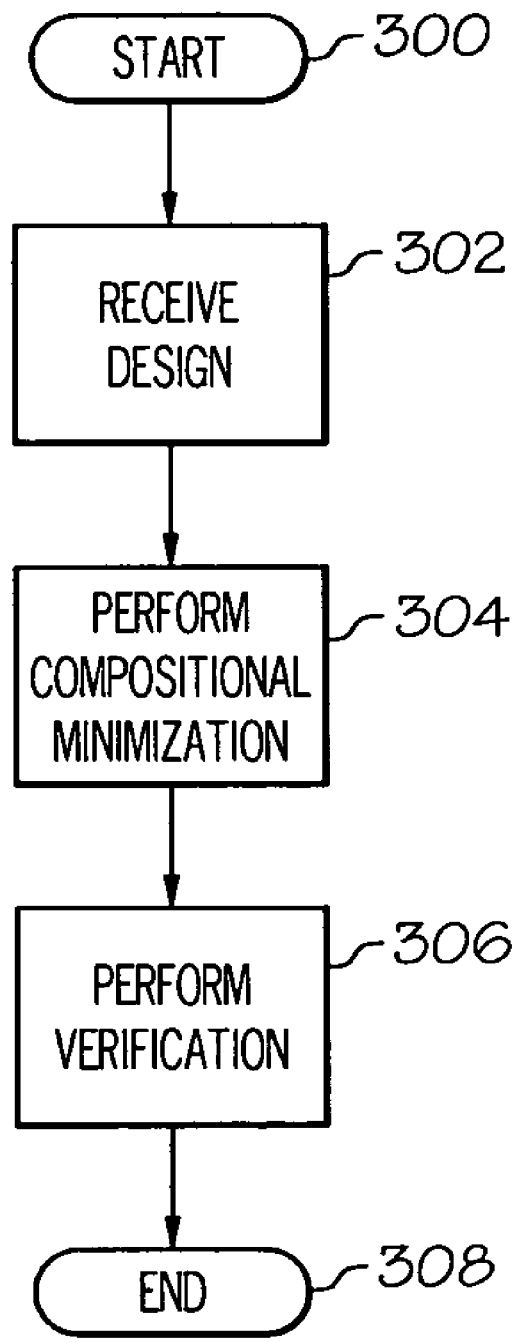
FIG. 3 is a high level logical flow chart of a process for performing verification in accordance with preferred embodiment of the present invention.

Referring now to FIG. 3, a high-level logical flow chart of a process for performing verification of a design in accordance with a preferred embodiment of the present invention is illustrated. The process starts at step 300, which depicts logic simulator 124 receiving a design in the form of design netlist 120. The process then proceeds to step 302. At step 302, compositional minimization module 138 performs compositional minimization according to the method described with respect to FIG. 2a. The process next moves to step 306, which illustrates logic simulator 124 performing verification of design netlist 120. The process then ends at step 308.

Accordingly, the present invention may suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analog communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

Software Deployment

Figure 4A:
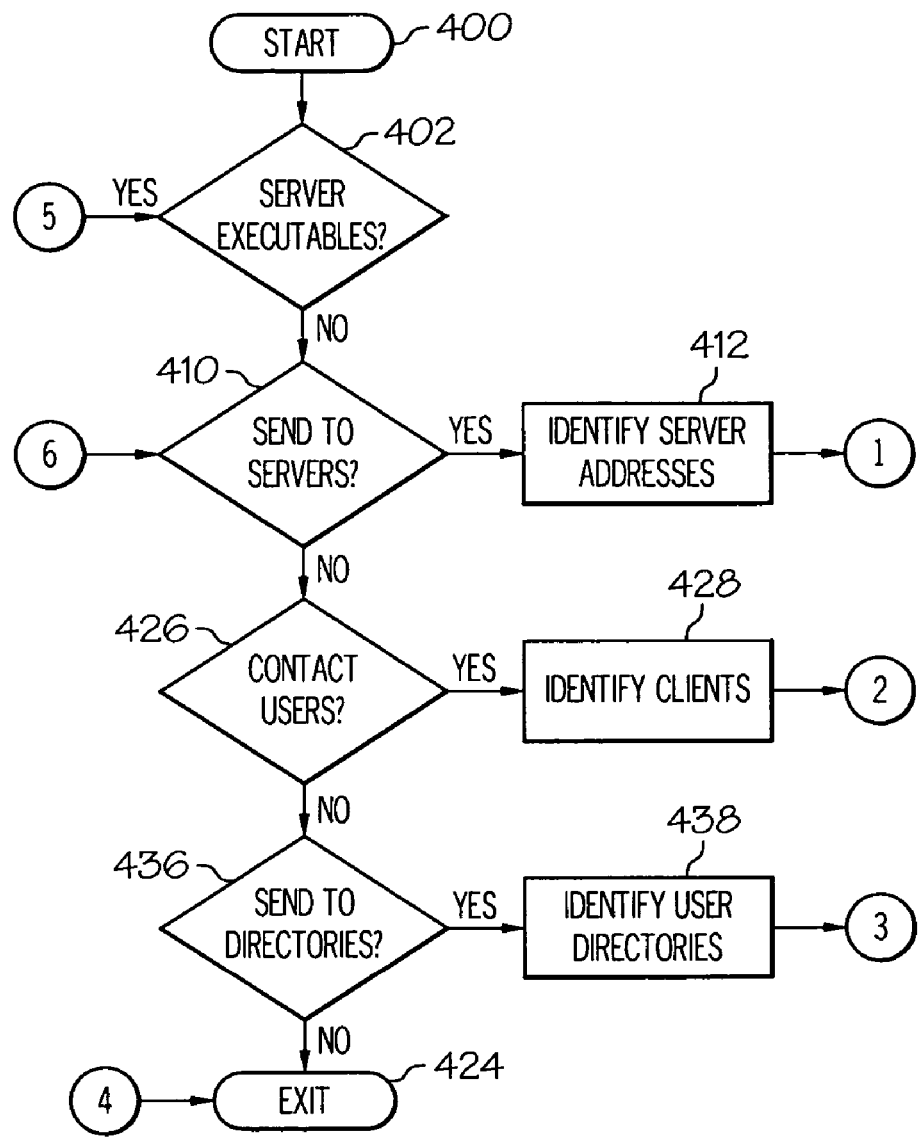
FIGS. 4a-b show a flow-chart of steps taken to deploy software capable of executing the steps shown in FIG. 2a-3.
Figure 4B:
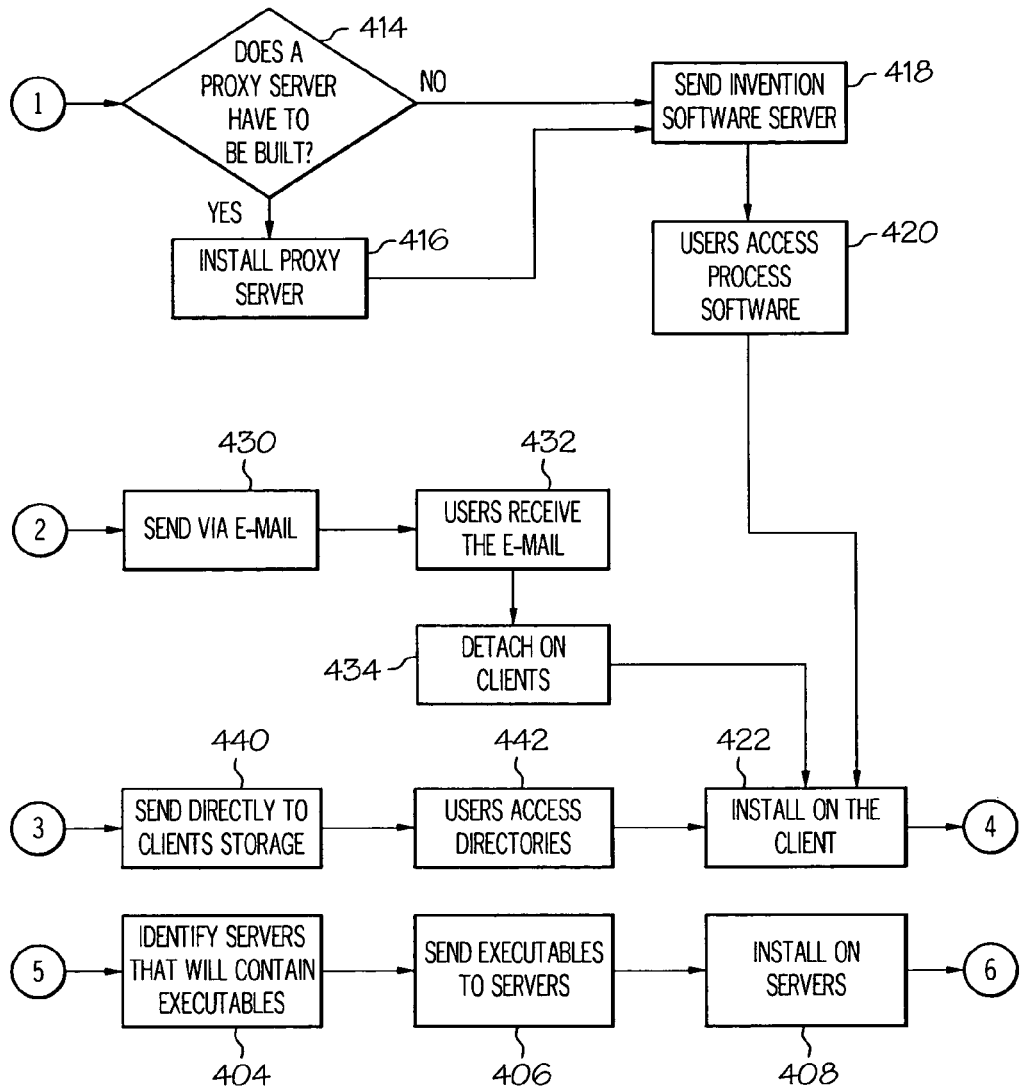

Thus, the method described herein, and in particular as shown in FIGS. 2 and 3, can be deployed as a process software. Referring now to FIG. 4, step 400 begins the deployment of the process software. The first thing is to determine if there are any programs that will reside on a server or servers when the process software is executed (query block 402). If this is the case, then the servers that will contain the executables are identified (block 404). The process software for the server or servers is transferred directly to the servers' storage via File Transfer Protocol (FTP) or some other protocol or by copying though the use of a shared file system (block 406). The process software is then installed on the servers (block 408).

Next, a determination is made on whether the process software is be deployed by having users access the process software on a server or servers (query block 410). If the users are to access the process software on servers, then the server addresses that will store the process software are identified (block 412).

A determination is made if a proxy server is to be built (query block 414) to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed (block 416). The process software is sent to the servers either via a protocol such as FTP or it is copied directly from the source files to the server files via file sharing (block 418). Another embodiment would be to send a transaction to the servers that contained the process software and have the server process the transaction, then receive and copy the process software to the server's file system. Once the process software is stored at the servers, the users via their client computers, then access the process software on the servers and copy to their client computers file systems (block 420). Another embodiment is to have the servers automatically copy the process software to each client and then run the installation program for the process software at each client computer. The user executes the program that installs the process software on his client computer (block 422) then exits the process (terminator block 424).

In query step 426, a determination is made whether the process software is to be deployed by sending the process software to users via e-mail. The set of users where the process software will be deployed are identified together with the addresses of the user client computers (block 428). The process software is sent via e-mail to each of the users' client computers (block 430). The users then receive the e-mail (block 432) and then detach the process software from the e-mail to a directory on their client computers (block 434). The user executes the program that installs the process software on his client computer (block 422) then exits the process (terminator block 424).

Lastly a determination is made on whether to the process software will be sent directly to user directories on their client computers (query block 436). If so, the user directories are identified (block 438). The process software is transferred directly to the user's client computer directory (block 440). This can be done in several ways such as but not limited to sharing of the file system directories and then copying from the sender's file system to the recipient user's file system or alternatively using a transfer protocol such as File Transfer Protocol (FTP). The users access the directories on their client file systems in preparation for installing the process software (block 442). The user executes the program that installs the process software on his client computer (block 422) and then exits the process (terminator block 424).

VPN Deployment

The present software can be deployed to third parties as part of a service wherein a third party VPN service is offered as a secure deployment vehicle or wherein a VPN is build on-demand as required for a specific deployment.

A virtual private network (VPN) is any combination of technologies that can be used to secure a connection through an otherwise unsecured or untrusted network. VPNs improve security and reduce operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee. Access to the software via a VPN can be provided as a service by specifically constructing the VPN for purposes of delivery or execution of the process software (i.e. the software resides elsewhere) wherein the lifetime of the VPN is limited to a given period of time or a given number of deployments based on an amount paid.

The process software may be deployed, accessed and executed through either a remote-access or a site-to-site VPN. When using the remote-access VPNs the process software is deployed, accessed and executed via the secure, encrypted connections between a company's private network and remote users through a third-party service provider. The enterprise service provider (ESP) sets a network access server (NAS) and provides the remote users with desktop client software for their computers. The telecommuters can then dial a toll-bee number or attach directly via a cable or DSL modem to reach the NAS and use their VPN client software to access the corporate network and to access, download and execute the process software.

When using the site-to-site VPN, the process software is deployed, accessed and executed through the use of dedicated equipment and large-scale encryption that are used to connect a companies multiple fixed sites over a public network such as the Internet.

The process software is transported over the VPN via tunneling which is the process the of placing an entire packet within another packet and sending it over a network. The protocol of the outer packet is understood by the network and both points, called runnel interfaces, where the packet enters and exits the network.

Figure 5A:
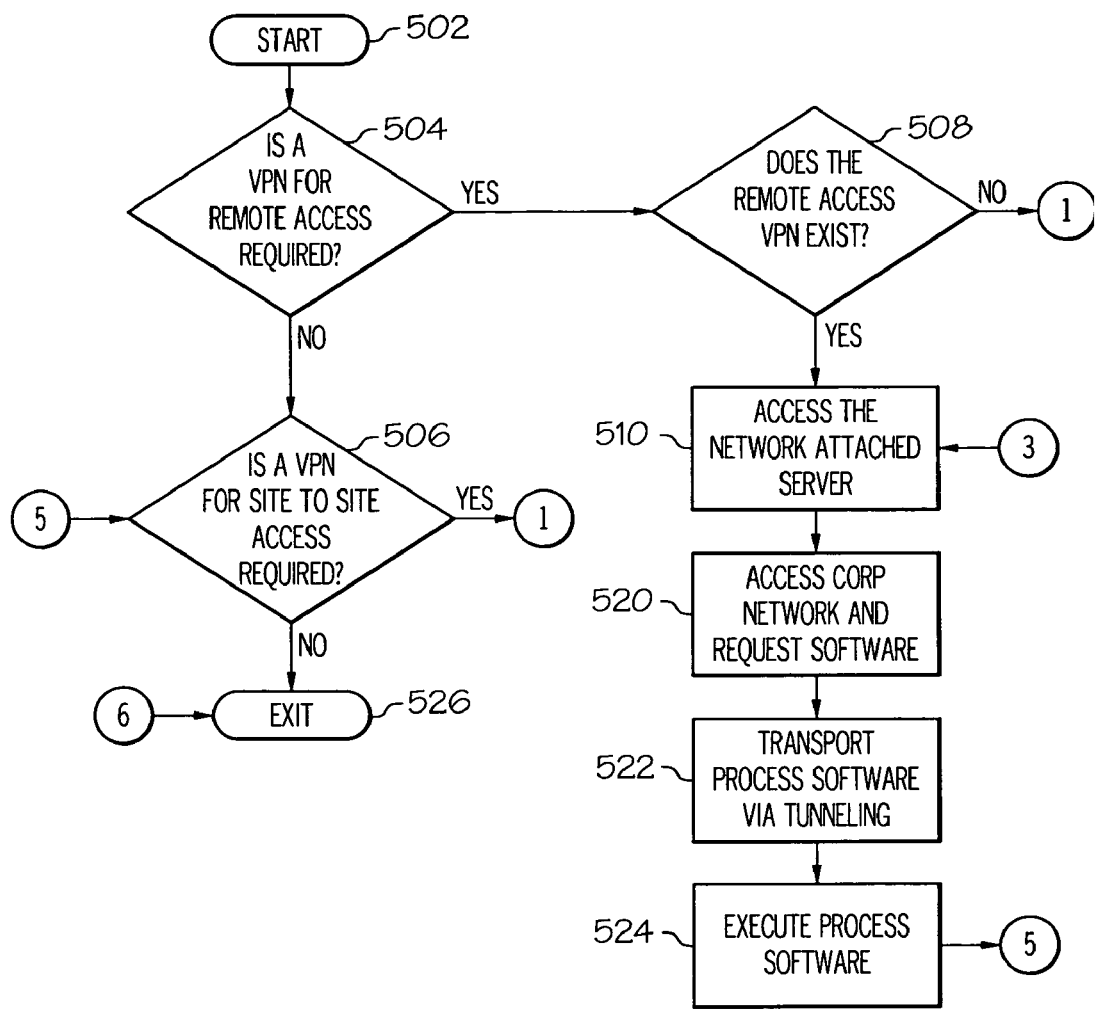
FIGS. 5a-c show a flow-chart of steps taken to deploy in a Virtual Private Network (VPN) software that is capable of executing the steps shown in FIGS. 2a-3.
Figures 5B, 5C:
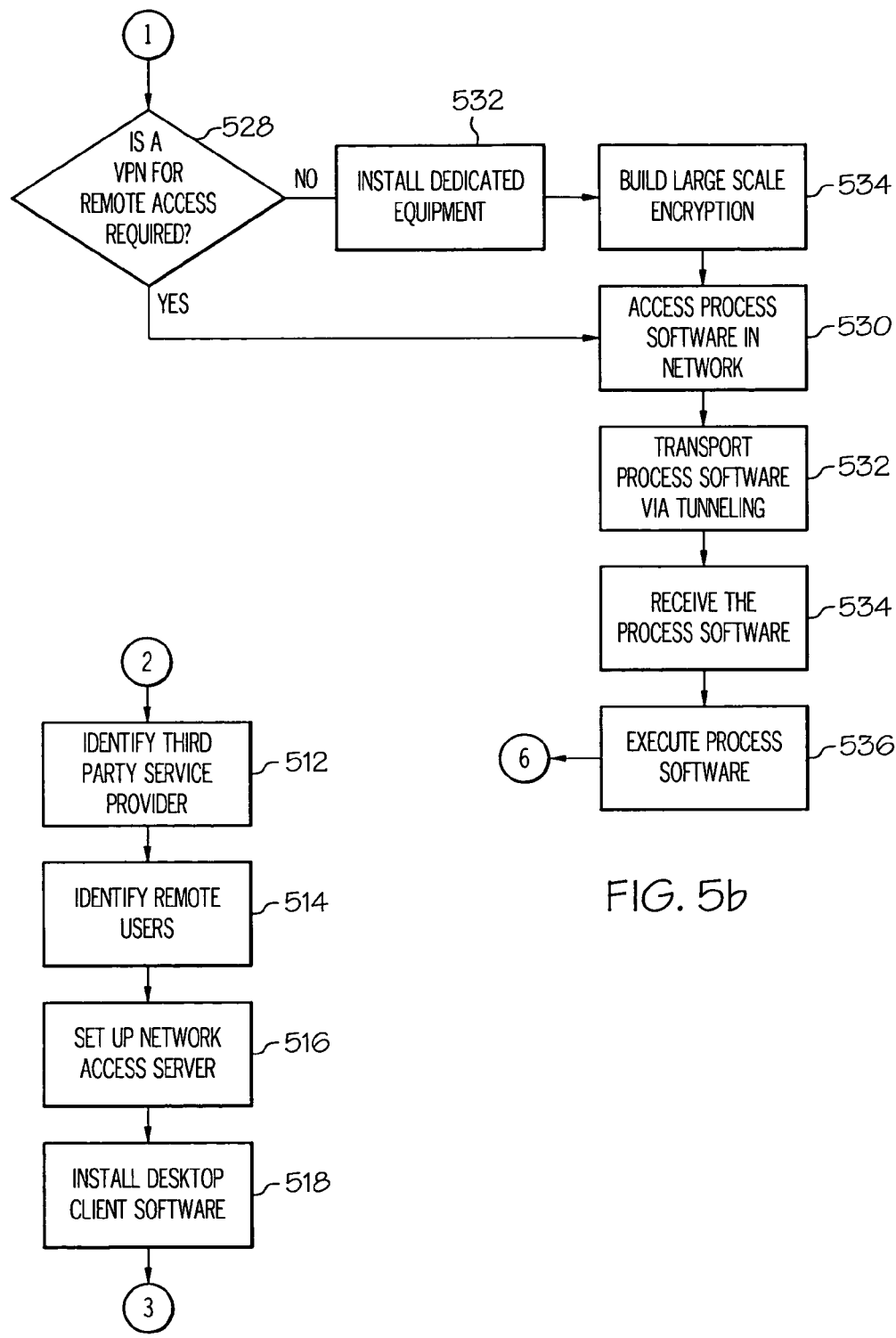

The process for such VPN deployment is described in FIG. 5. Initiator block 502 begins the Virtual Private Network (VPN) process. A determination is made to see if a VPN for remote access is required (query block 504). If it is not required, then proceed to (query block 506). If it is required, then determine if the remote access VPN exists (query block 508).

If a VPN does exist, then proceed to block 510. Otherwise identify a third party provider that will provide the secure, encrypted connections between the company's private network and the company's remote users (block 512). The company's remote users are identified (block 514). The third party provider then sets up a network access server (NAS) (block 516) that allows the remote users to dial a toll free number or attach directly via a broadband modem to access, download and install the desktop client software for the remote-access VPN (block 518).

After the remote access VPN has been built or if it been previously installed, the remote users can access the process software by dialing into the NAS or attaching directly via a cable or DSL modem into the NAS (block 510). This allows entry into the corporate network where the process software is accessed (block 520). The process software is transported to the remote user's desktop over the network via tunneling. That is the process software is divided into packets and each packet including the data and protocol is placed within another packet (block 522). When the process software arrives at the remote user's desk-top, it is removed from the packets, reconstituted and then is executed on the remote users desk-top (block 524).

A determination is then made to see if a VPN for site to site access is required (query block 506). If it is not required, then proceed to exit the process (terminator block 526). Otherwise, determine if the site to site VPN exists (query block 528). If it does exist, then proceed to block 530. Otherwise, install the dedicated equipment required to establish a site to site VPN (block 532). Then build the large scale encryption into the VPN (block 534).

After the site to site VPN has been built or if it had been previously established, the users access the process software via the VPN (block 530). The process software is transported to the site users over the network via tunneling (block 532). That is the process software is divided into packets and each packet including the data and protocol is placed within another packet (block 534). When the process software arrives at the remote user's desktop, it is removed from the packets, reconstituted and is executed on the site users desktop (block 536). The process then ends at terminator block 526.

Software Integration

The process software which consists code for implementing the process described herein may be integrated into a client, server and network environment by providing for the process software to coexist with applications, operating systems and network operating systems software and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists matches the parameter lists required by the process software. Conversely parameters passed by the software applications to the process software will be checked to ensure the parameters match the parameters required by the process software. The client and server operating systems including the network operating systems will be identified and compared to the list of operating systems, version numbers and network software that have been tested to work with the process software. Those operating systems, version numbers and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 6A:
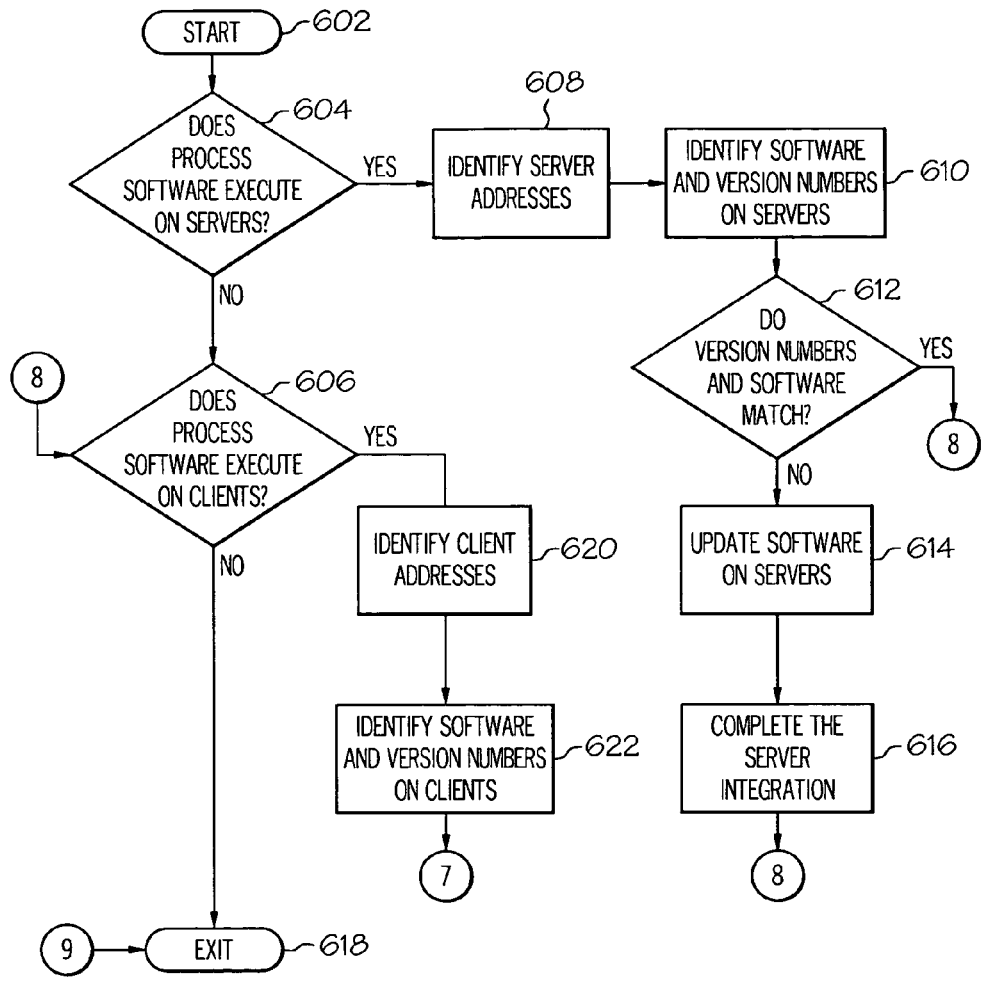
FIGS. 6a-b show a flow-chart showing steps taken to integrate into an computer system software that is capable of executing the steps shown in FIGS. 2a-3.
Figure 6B:
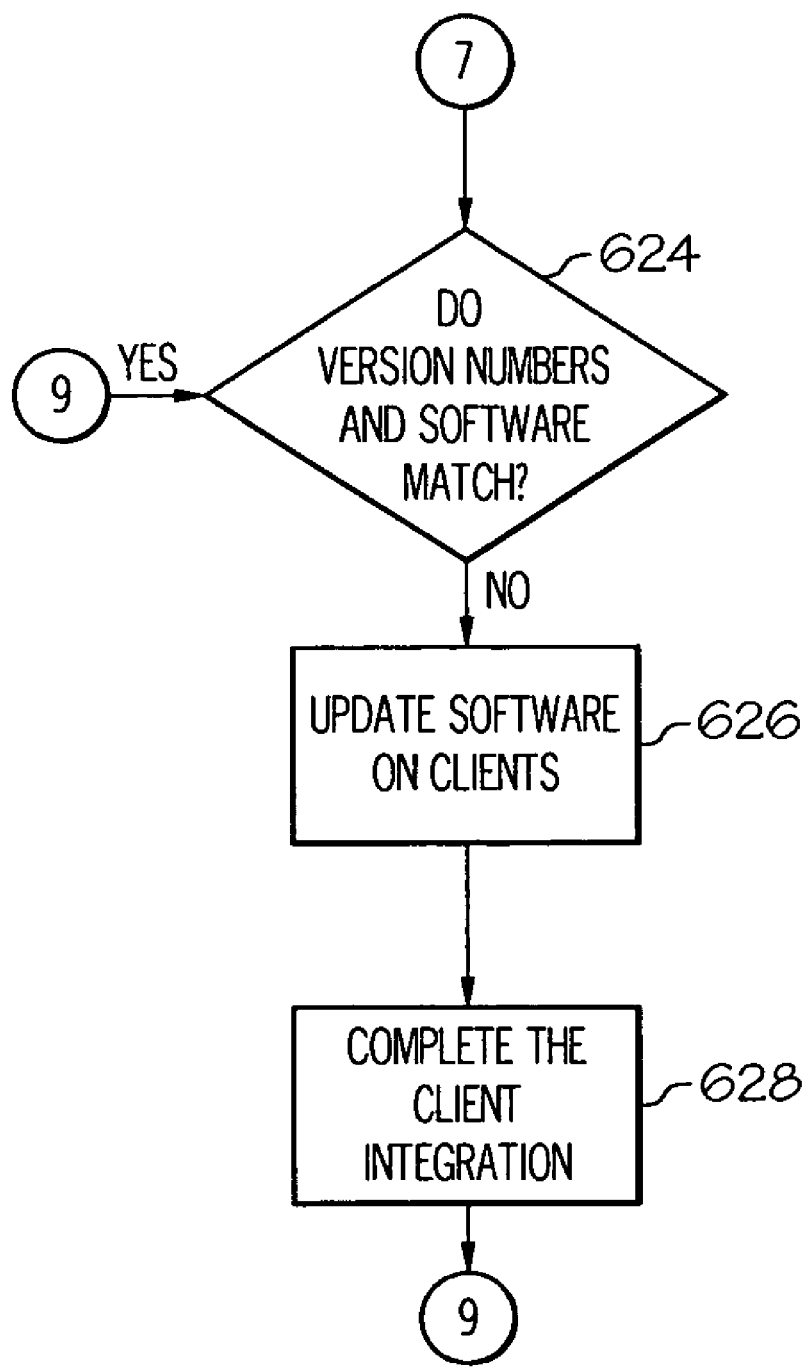

For a high-level description of this process, reference is now made to FIG. 6. Initiator block 602 begins the integration of the process software. The first tiling is to determine if there are any process software programs that will execute on a server or servers (block 604). If this is not the case, then integration proceeds to query block 606. If this is the case, then the server addresses are identified (block 608). The servers are checked to see if they contain software that includes the operating system (OS), applications, and network operating systems (NOS), together with their version numbers, which have been tested with the process software (block 610). The servers are also checked to determine if there is any missing software that is required by the process software in block 610.

A determination is made if the version numbers match the version numbers of OS, applications and NOS that have been tested with the process software (block 612). If all of the versions match and there is no missing required software the integration continues in query block 606.

If one or more of the version numbers do not match, then the unmatched versions are updated on the server or servers with the correct versions (block 614). Additionally, if there is missing required software, then it is updated on the server or servers in the step shown in block 614. The server integration is completed by installing the process software (block 616).

The step shown in query block 606, which follows either the steps shown in block 604, 612 or 616 determines if there are any programs of the process software that will execute on the clients. If no process software programs execute on the clients the integration proceeds to terminator block 618 and exits. If this not the case, then the client addresses are identified as shown in block 620.

The clients are checked to see if they contain software that includes the operating system (OS), applications, and network operating systems (NOS), together with their version numbers, which have been tested with the process software (block 622). The clients are also checked to determine if there is any missing software that is required by the process software in the step described by block 622.

A determination is made is the version numbers match the version numbers of OS, applications and NOS that have been tested with the process software (query block 624). If all of the versions match and there is no missing required software, then the integration proceeds to terminator block 618 and exits.

If one or more of the version numbers do not match, then the unmatched versions are updated on the clients with the correct versions (block 626). In addition, if there is missing required software then it is updated on the clients (also block 626). The client integration is completed by installing the process software on the clients (block 628). The integration proceeds to terminator block 618 and exits.

On Demand

The process software is shared, simultaneously serving multiple customers in a flexible, automated fashion. It is standardized, requiring little customization and it is scalable, providing capacity on demand in a pay-as-you-go model.

The process software can be stored on a shared file system accessible from one or more servers. The process software is executed via transactions that contain data and server processing requests that use CPU units on the accessed server. CPU units are units of time such as minutes, seconds, hours on the central processor of the server. Additionally the assessed server may make requests of other servers that require CPU units. CPU units are an example that represents but one measurement of use. Other measurements of use include but are not limited to network bandwidth, memory usage, storage usage, packet transfers, complete transactions etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise when other measurements of use such as network bandwidth, memory usage, storage usage, etc. approach a capacity so as to affect performance, additional network bandwidth, memory usage, storage etc. are added to share the workload.

The measurements of use used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and or indicated on a web site accessed by the customer which then remits payment to the service provider.

In another embodiment, the service provider requests payment directly from a customer account at a banking or financial institution.

In another embodiment, if the service provider is also a customer of the customer that uses the process software application, the payment owed to the service provider is reconciled to the payment owed by the service provider to minimize the transfer of payments.

Figure 7A:
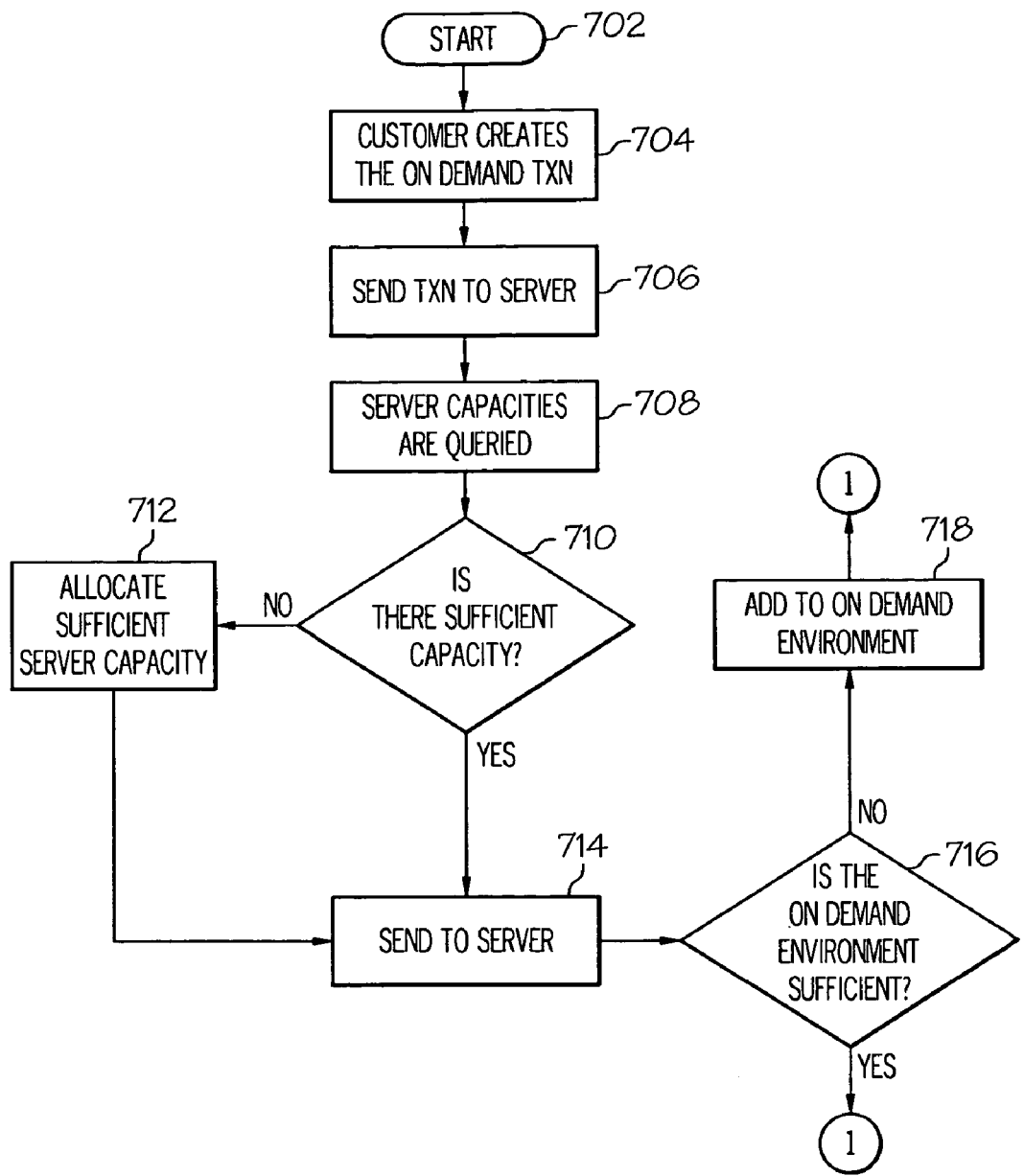
FIGS. 7a-b show a flow-chart showing steps taken to execute the steps shown in FIGS. 2a-3 using an on-demand service provider.
Figure 7B:
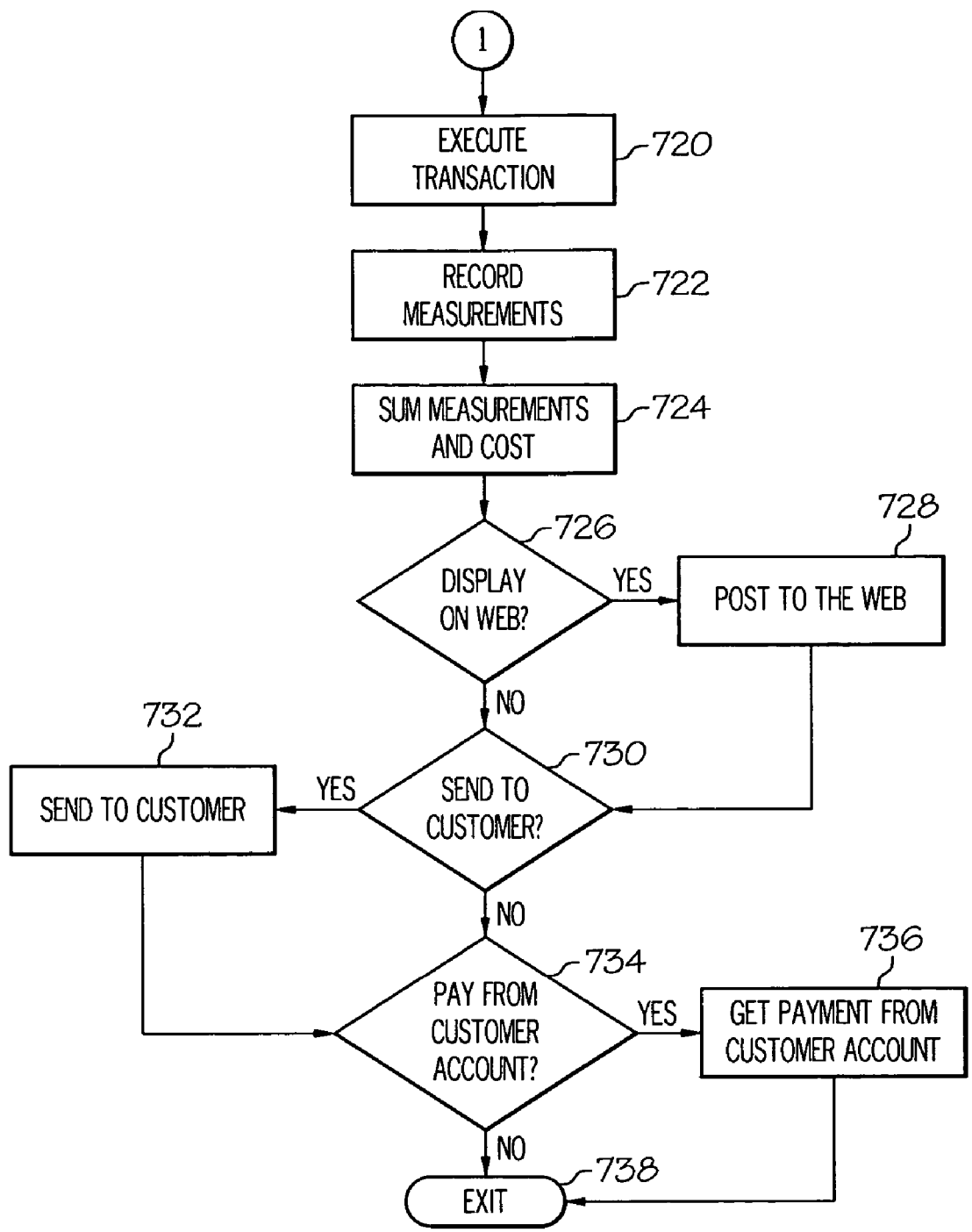

With reference now to FIG. 7, initiator block 702 begins the On Demand process. A transaction is created than contains the unique customer identification, the requested service type and any service parameters that further, specify the type of service (block 704). The transaction is then sent to the main server (block 706). In an On Demand environment the main server can initially be the only server, then as capacity is consumed other servers are added to the On Demand environment.

The server central processing unit-(CPU) capacities in the On Demand environment are queried (block 708). The CPU requirement of the transaction is estimated, then the servers available CPU capacity in the On Demand environment are compared to the transaction CPU requirement to see if there is sufficient CPU available capacity in any server to process the transaction (query block 710). If there is not sufficient server CPU available capacity, then additional server CPU capacity is allocated to process the transaction (block 712). If there was already sufficient Available CPU capacity then the transaction is sent to a selected server (block 714).

Before executing the transaction, a check is made of the remaining On Demand environment to determine if the environment has sufficient available capacity for processing the transaction. This environment capacity consists of such things as but not limited to network bandwidth, processor memory, storage etc. (block 716). If there is not sufficient available capacity, then capacity will be added to the On Demand environment (block 718). Next the required software to process the transaction is accessed, loaded into memory, then the transaction is executed (block 720).

The usage measurements are recorded (block 722). The usage measurements consist of the portions of those functions in the On Demand environment that are used to process the transaction. The usage of such functions as, but not limited to, network bandwidth, processor memory, storage and CPU cycles are what is recorded. The usage measurements are summed, multiplied by unit costs and then recorded as a charge to the requesting customer (block 724).

If the customer has requested that the On Demand costs be posted to a web site (query block 726), then they are posted (block 728). If the customer has requested that the On Demand costs be sent via e-mail to a customer address (query block 730), then these costs are sent to the customer (block 732). If the customer has requested that the On Demand costs be paid directly from a customer account (query block 734), then payment is received directly from the customer account (block 736). The On Demand process is then exited at terminator block 738.

While the invention has been particularly shown as described with reference to a preferred embodiment, it will be understood by those skilled in the art that various changes in form and detail may be made therein without departing from the spirit and scope of the invention. It is also important to note that although the present invention has been described in the context of a fully functional computer system, those skilled in the art will appreciate that the mechanisms of the present invention are capable of being distributed as a program product in a variety of forms, and that the present invention applies equally regardless of the particular type of signal bearing media utilized to actually carry out the distribution. Examples of signal bearing media include, without limitation, recordable type media such as floppy disks or CD ROMs and transmission type media such as analog or digital communication links.

What is claimed is:

1. A method in data processing system, said method comprising:
    importing a design netlist containing one or more components;
    computing one or more output functions for said one or more components;
    generating one or more output equivalent state sets from said one or more output functions;
    identifying one or more next-state functions for said one or more components;
    producing one or more image equivalent state sets for said one or more next-state functions;
    classifying one or more output-and-image equivalent states for said one or more image equivalent state sets and said one or more output equivalent state sets;
    getting a preimage from said one or more next-state functions and said one or more output-and-image equivalent states to generate a preimage of said one or more output-and-image equivalent states;
    partitioning over one or more original states of said one or more components, and one or more equivalent class input sets of said one or more components;
    selecting one or more input representatives of said one or more equivalent class input sets;
    forming an input map from said one or more input representatives;
    synthesizing said input map; and
    injecting said input map back into said netlist to generate a modified netlist.

2. The method of claim 1, wherein said step of producing one or more image equivalent states for said one or more next-state functions and said step of getting a preimage from said one or more next state functions and said one or more output-and-image equivalent states to generate said preimage of said one or more output-and-image equivalent states are performed in parallel.

3. The method of claim 1, further comprising the step of performing verification of said modified netlist.

4. The method of claim 1, wherein said step of computing said one or more output functions for said one or more components and said step of identifying said one or more next-state functions for said one or more components are performed in parallel.

5. The method of claim 1, further comprising employing redundancy removal.

* * * * *